US012562229B2

(12) United States Patent
Shiraishi

(10) Patent No.: US 12,562,229 B2
(45) Date of Patent: Feb. 24, 2026

(54) SEMICONDUCTOR INTEGRATED CIRCUIT, SEMICONDUCTOR DEVICE, AND SEMICONDUCTOR MEMORY DEVICE

(71) Applicant: Kioxia Corporation, Tokyo (JP)

(72) Inventor: Mikio Shiraishi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 139 days.

(21) Appl. No.: 18/538,457

(22) Filed: Dec. 13, 2023

(65) Prior Publication Data

US 2024/0257884 A1 Aug. 1, 2024

(30) Foreign Application Priority Data

Jan. 27, 2023 (JP) ................................. 2023-010691

(51) Int. Cl.
| | |
|---|---|
| *G11C 7/10* | (2006.01) |
| *G11C 7/22* | (2006.01) |
| *G11C 16/32* | (2006.01) |
| *H03K 23/00* | (2006.01) |

(52) U.S. Cl.
CPC ............... *G11C 16/32* (2013.01); *G11C 7/10* (2013.01); *G11C 7/222* (2013.01); *H03K 23/005* (2013.01)

(58) Field of Classification Search
CPC ........... G11C 16/32; G11C 7/10; G11C 7/222; H03K 23/005
See application file for complete search history.

(56) References Cited

U.S. PATENT DOCUMENTS

| | | | |
|---|---|---|---|
| 4,937,845 A | 6/1990 | Warner | |
| 6,727,738 B2 | 4/2004 | Tsukikawa | |
| 10,419,003 B1 * | 9/2019 | Kim ..................... | H03K 23/005 |
| 11,757,453 B2 * | 9/2023 | Morikawa .............. | H03K 23/40 |
| | | | 377/34 |
| 2025/0096782 A1 * | 3/2025 | Shiraishi ................ | H03K 3/037 |

FOREIGN PATENT DOCUMENTS

| | | |
|---|---|---|
| JP | 2008-131071 A | 6/2008 |
| JP | 2010-220148 A | 9/2010 |
| JP | 4592179 B2 | 12/2010 |

OTHER PUBLICATIONS

M. Cohen and S. Even, A Gray code counter, IEEE Transactions on Computers, vol. C-18, No. 7, pp. 662-664, Jul. 1969.

* cited by examiner

*Primary Examiner* — Jay W. Radke
(74) *Attorney, Agent, or Firm* — Foley & Lardner LLP

(57) ABSTRACT
According to one embodiment, a clock signal is input to clock terminals of first and second flip-flops of a semiconductor integrated circuit. A first signal output from a Q terminal of the second flip-flop is input to a D terminal of the first flip-flop. An inverter inverts a second signal output from a Q terminal of the first flip-flop, and a third signal obtained by inverting the second signal is input to a D terminal of the second flip-flop. Adders respectively operate on different bits of a gray code by performing addition based on an input carry signal. A circuit block generates a carry signal to be input to a first adder by performing an AND operation of the first and third signals. The circuit block generates a carry signal to be input to other adders based on the first and second signals.

20 Claims, 7 Drawing Sheets

| Q3 | Q2 | Q1 | Q0 | Q (-1) |
|----|----|----|----|--------|
| 0 | 0 | 0 | 0 | 0 |
| 0 | 0 | 0 | 1 | 0 |
| 0 | 0 | 1 | 1 | 1 |
| 0 | 0 | 1 | 0 | 1 |
| 0 | 1 | 1 | 0 | 0 |
| 0 | 1 | 1 | 1 | 0 |
| 0 | 1 | 0 | 1 | 1 |
| 0 | 1 | 0 | 0 | 1 |
| 1 | 1 | 0 | 0 | 0 |
| 1 | 1 | 0 | 1 | 0 |
| 1 | 1 | 1 | 1 | 1 |
| 1 | 1 | 1 | 0 | 1 |
| 1 | 0 | 1 | 0 | 0 |
| 1 | 0 | 1 | 1 | 0 |
| 1 | 0 | 0 | 1 | 1 |
| 1 | 0 | 0 | 0 | 1 |

FIG.4

SEMICONDUCTOR INTEGRATED CIRCUIT, SEMICONDUCTOR DEVICE, AND SEMICONDUCTOR MEMORY DEVICE

CROSS-REFERENCE TO RELATED APPLICATIONS

This application is based upon and claims the benefit of priority from Japanese Patent Application No. 2023-010691, filed on Jan. 27, 2023; the entire contents of which are incorporated herein by reference.

FIELD

Embodiments described herein relate generally to a semiconductor integrated circuit, a semiconductor device, and a semiconductor memory device.

BACKGROUND

Examples of a semiconductor integrated circuit that outputs a gray code according to a count value of a clock include a gray code counter. The gray code is a code that changes only by one bit with respect to a change in the count value.

BRIEF DESCRIPTION OF THE DRAWINGS

FIG. 1 is a diagram illustrating an example of a circuit configuration of a gray code counter that is a semiconductor integrated circuit according to a first embodiment;

FIG. 3 is a truth table corresponding to the timing chart illustrated in FIG. 2;

FIG. 4 is a schematic diagram illustrating an example of a configuration of a memory system according to a second embodiment;

DETAILED DESCRIPTION

Figure 2:
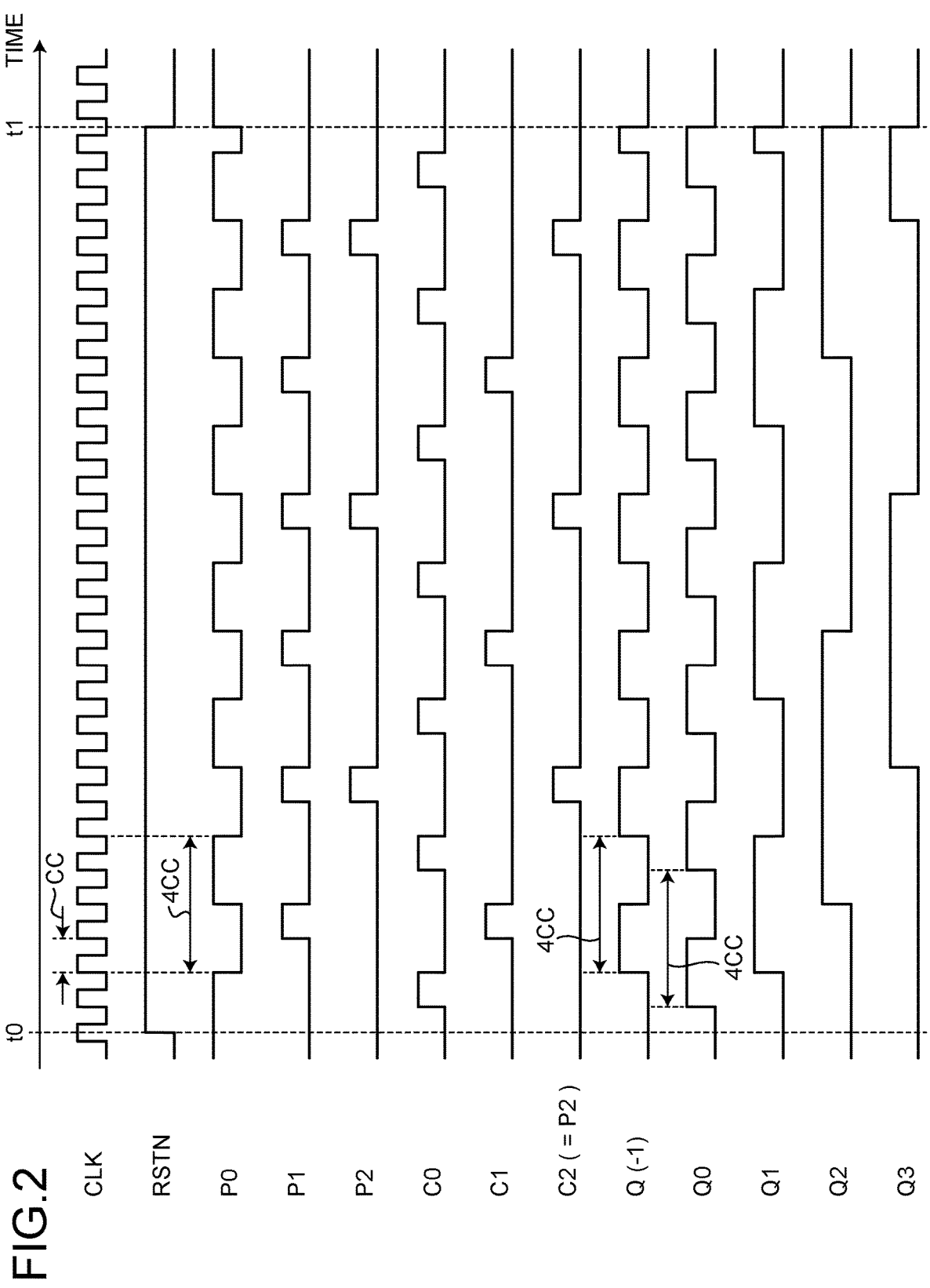
FIG. 2 is a timing chart illustrating an example of transition of various signals according to a clock signal and a reset signal in the gray code counter according to the first embodiment.

In general, according to one embodiment, a semiconductor integrated circuit is configured to generate an L-bit (wherein L is an integer of 3 or more) gray code according to a count value of a first clock signal. The semiconductor integrated circuit includes a first flip-flop, a second flip-flop, an inverter, (L−1) adders, a circuit block, a first terminal, and (L−1) second terminals. The first clock signal is configured to be input to a clock terminal of the first flip-flop. The first clock signal is configured to be input to a clock terminal of the second flip-flop. A first signal output from a Q terminal of the second flip-flop is input to a D terminal of the first flip-flop. The inverter performs an inversion operation on a second signal output from a Q terminal of the first flip-flop. A third signal obtained by inverting the second signal output from the inverter is input to a D terminal of the second flip-flop. Each of the (L−1) adders respectively generates and operates on a different bit of the gray code by performing addition based on a respective bit of an input carry signal. The circuit block generates an input carry signal and outputs a first bit of the input carry signal to a first adder among the (L−1) adders by performing an AND operation of the first signal and the third signal. The circuit block outputs a respective bit of the remaining bit or bits of the input carry signal to each of a second adder to an (L−1)th adder of the (L−1) adders based on the first signal and the second signal. The first terminal outputs the first signal. The (L−1) second terminals output a set of signals output from the (L−1) adders.

Exemplary embodiments of a semiconductor integrated circuit, a semiconductor device, and a semiconductor memory device will be described below in detail with reference to the accompanying drawings. Note that the present invention is not limited to the following embodiments.

First Embodiment

Figure 1:
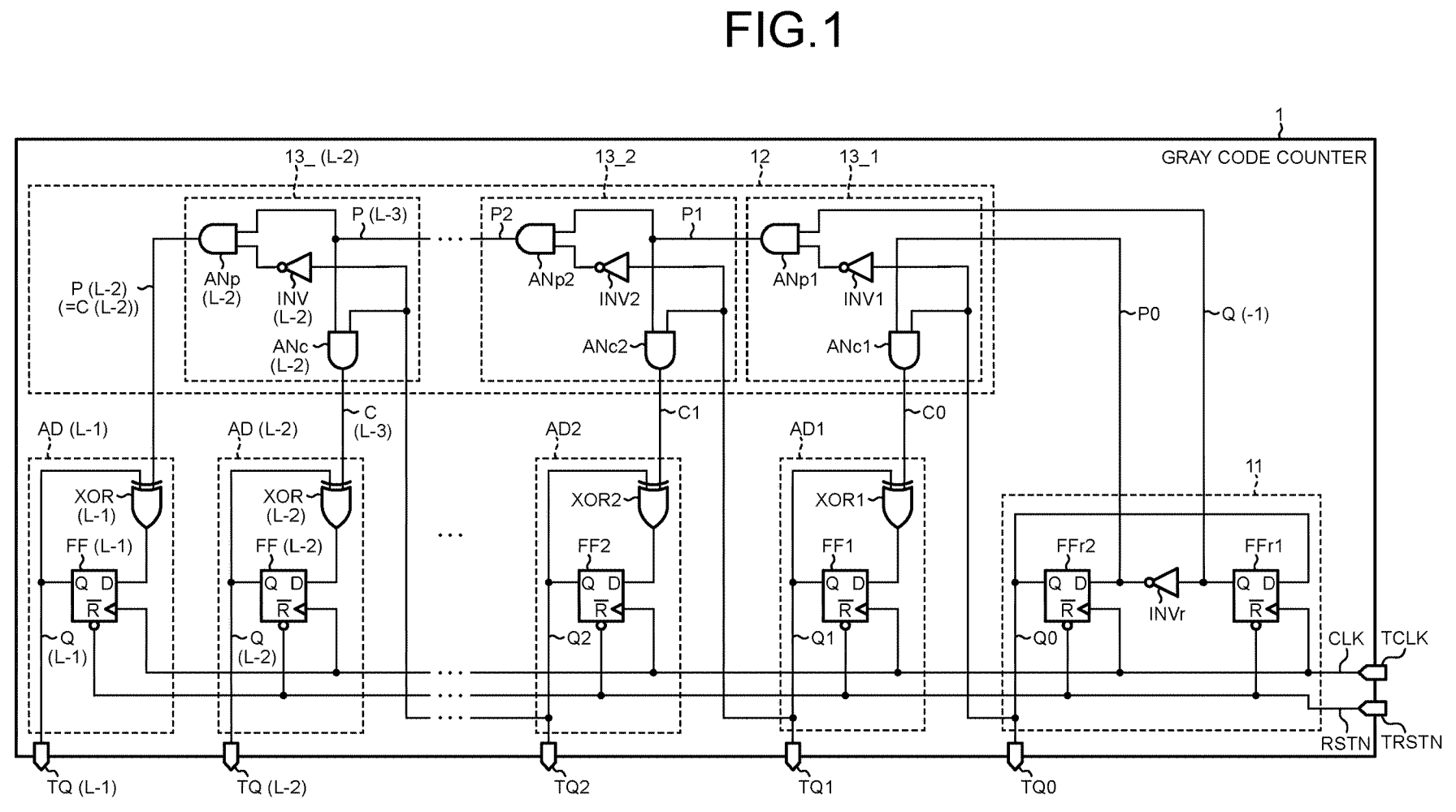

FIG. 1 is a diagram illustrating an example of a circuit configuration of a gray code counter that is a semiconductor integrated circuit according to a first embodiment. In the following description, regarding a logical value corresponding to a signal level, it is assumed that the H state represents "1" and the L state represents "0".

A gray code counter 1 outputs an L-bit (where L is an integer of 3 or more) gray code according to a count value of a clock signal CLK that is input to the gray code counter 1.

The gray code counter 1 includes a clock terminal TCLK to which the clock signal CLK is input, a reset input terminal TRSTN to which a reset signal RSTN is input, and L data output terminals TQ0 to TQ(L−1) that output different bits of the L-bit gray code.

In this specification, the least significant bit of the gray code is referred to as a 0-th bit, and an i-th (where i is an integer from 0 to (L−1)) bit from the least significant bit of the gray code is referred to as an i-th bit. A data output terminal TQi outputs the i-th bit of the gray code. A signal indicating i-th bit data of the gray code is referred to as a data signal Qi. Hereinafter, each of the data output terminals TQ0 to TQ(L−1) may be referred to as a data output terminal TQ. In addition, the data signals Q0 to Q (L−1) may be collectively referred to as a data signal Q.

The gray code counter 1 includes a first circuit block 11, a second circuit block 12, and (L−1) adders AD1 to AD(L−1). Hereinafter, each of the adders AD1 to AD(L−1) may be referred to as an adder AD.

Each adder AD receives a respective bit of a carry signal C from the second circuit block 12. Each of the adders AD respectively operates on a different bit of the gray code by performing addition based on the input carry signal C, and outputs data in bits obtained by the operation as the data signal Q. Hereinafter, the carry signal C that is input to an adder ADj (where j is an integer from 1 to (L−1)) is referred to as a carry signal C(j−1).

The adder ADj includes an XOR circuit XORj that performs an exclusive OR (in other words, XOR) operation, and a flip-flop FFj. Note that the flip-flop FFj is a D flip-flop including a Q terminal, a D terminal, a clock terminal, and a reset terminal.

The XOR circuit XORj includes two input terminals, and the Q terminal of the flip-flop FFj is connected to one of the two input terminals. The second circuit block 12 is connected to the other of the two input terminals of the XOR circuit XORj, and the carry signal C(j−1) is input to the other of the two input terminals of the XOR circuit XORj as the carry signal C from the second circuit block 12. An output terminal of the XOR circuit XORj is connected to the D terminal of the flip-flop FFj.

Data output from the Q terminal of the flip-flop FFj is a data signal Qj. Therefore, the XOR circuit XORj inverts the data signal Qj to output the resultant in a case where the carry signal C is "1", and outputs the data signal Qj without inverting the data signal Qj in a case where the carry signal C is "0".

The flip-flop FFj takes in the signal that is input from the XOR circuit XORj to the D terminal at the next clock cycle (to be precise, at the next rising timing of the clock signal CLK), and outputs the taken signal from the Q terminal.

Therefore, in a case where the carry signal C(j−1) is "1", the adder ADj performs a bitwise operation of adding "1" to the value represented by the current data signal Qj, and outputs the signal after the bitwise operation as the data signal Qj in the next clock cycle. In a case where the carry signal C(j−1) is "0", the adder ADj does not change the value represented by the current data signal Qj, and outputs the resultant as the data signal Qj in the next clock cycle.

The Q terminal of the flip-flop FFj is connected to a data output terminal TQj of the data output terminals TQ1 to TQ(L−1). Therefore, the data output terminals TQ1 to TQ(L−1) output a set of data signals Q1 to Q(L−1) output from the adders AD1 to AD(L−1).

The reset terminal of the flip-flop FFj receives input of the reset signal RSTN. Note that, in this example, the flip-flop FFj is reset in a case where the reset signal RSTN is "0".

The second circuit block 12 generates operates on the carry signal C that is input to the adders AD1 to AD(L−1), that is, carry signals C0 to C(L−2), based on a reference signal input from the first circuit block 11.

The second circuit block 12 may generate the carry signals C0 to C(L−2) by the ripple carry method or may generate the carry signals C0 to C(L−2) by the carry look ahead method. In the example illustrated in FIG. 1, the second circuit block 12 has a configuration for generating the carry signals C0 to C(L−2) by the ripple carry method.

The second circuit block 12 includes (L−2) element blocks 13_1 to 13_(L−2) connected in series. The element blocks 13_1 to 13_(L−2) may be collectively referred to as an element block 13.

A carry generation signal P, which is a signal used to generate the carry signal C, is propagated from the element block 13_1 to the element block 13_(L−2). Each element block 13 generates a carry signal C and a carry generation signal P to be propagated to the element block 13 in the subsequent stage based on the carry generation signal P that has been propagated to the subject element block 13. A carry generation signal P generated by an element block 13_m (where m is an integer from 1 to (L−2)) is referred to as a carry generation signal Pm.

The element block 13_1 includes an AND circuit ANp1, and outputs a carry generation signal P1 from an output terminal of the AND circuit ANp1. Before describing the configuration of the element block 13_1 in further detail, first, the configurations of the element blocks 13_2 to 13_(L−2) will be detailed.

The configurations of the element blocks 13_2 to 13_(L−2) are common to each other. An element block 13_k (where k is an integer from 2 to (L−2)) generates a carry signal C(k−1) and a carry generation signal Pk based on a carry generation signal P(k−1) and a data signal Q(k−1).

The element block 13_k includes two AND circuits ANpk and ANck and an inverter INVk. Each of the AND circuits ANpk and ANck includes two input terminals.

A Q terminal of a flip-flop FF(k−1) included in an adder AD(k−1) is connected to one of the two input terminals of the AND circuit ANck, and the data signal Q(k−1) output from the Q terminal of the flip-flop FF(k−1) is input to the one of the two input terminals of the AND circuit ANck. An element block 13_(k−1), more precisely, an output terminal of an AND circuit ANp(k−1) included in the element block 13_(k−1) is connected to the other of the two input terminals of the AND circuit ANck, and the carry generation signal P(k−1) is input to the other of the two input terminals of the AND circuit ANck. An output terminal of the AND circuit ANck is connected to the other of two input terminals of an XOR circuit XORk included in an adder ADk.

The AND circuit ANck performs an AND operation of the data signal Q(k−1) and the carry generation signal P(k−1), and a signal obtained by the AND operation is input to the XOR circuit XORk as the carry signal C(k−1).

The Q terminal of the flip-flop FF(k−1) is connected to an input terminal of the inverter INVk, and the data signal Q(k−1) output from the Q terminal of the flip-flop FF(k−1) is input to the input terminal of the inverter INVk. The inverter INVk performs an inversion operation on the data signal Q(k−1).

The output terminal of the AND circuit ANp(k−1) included in the element block 13_(k−1) is connected to one of the two input terminals of the AND circuit ANpk, and the carry generation signal P(k−1) output from the AND circuit ANp(k−1) is input to the one of the two input terminals of the AND circuit ANpk. An output terminal of the inverter INVk is connected to the other of the two input terminals of the AND circuit ANpk, and the data signal Q (k−1) inverted by the inverter INVk is input to the other of the two input terminals of the AND circuit ANpk. The AND circuit ANpk performs an AND operation of the carry generation signal P(k−1) and the inverted data signal Q(k−1). The signal obtained by the AND operation is output from the element block 13_k as the carry generation signal Pk.

In this manner, the carry generation signal P is propagated from the element block 13_2 to the element block 13_(L−2). Each element block 13_k generates a carry signal C(k−1) based on the carry generation signal P(k−1) propagated from the element block 13_(k−1) in the previous stage and the data signal Q(k−1) output from the adder AD(k−1). Further, each element block 13_k newly generates a carry generation signal Pk based on the carry generation signal P(k−1) and the data signal Q(k−1), and propagates the carry generation signal Pk thus generated to an element block 13_(k+1) in the subsequent stage.

In the element block 13_(L−2) that is the element block 13 at the last stage of the element blocks 13_2 to 13_(L−2), an output terminal of an AND circuit ANp(L−2) is connected to the other of two input terminals of an XOR circuit XOR(L−1) included in the adder AD(L−1). A carry generation signal P(L−2) output from the output terminal of the AND circuit ANp(L−2) is input to the XOR circuit XOR (L−1) as the carry signal C(L−2).

The first circuit block 11 generates a reference signal that is supplied to the second circuit block 12 based on the clock signal CLK.

Here, a technique to be compared with the embodiment will be described. The technique to be compared with the embodiment is referred to as a comparative example. According to the comparative example, a circuit block for generating a reference signal includes a D flip-flop. The D flip-flop included in the circuit block for generating a reference signal is referred to as a reference flip-flop.

In the comparative example, a clock signal is input to a clock terminal of the reference flip-flop, and data held by the reference flip-flop is inverted every clock cycle. The circuit block generates a reference signal based on the data that is inverted every clock cycle and is held by the reference flip-flop.

Since the gray code changes only by one bit every clock cycle, the power consumption due to data inversion in a flip-flop (for example, flip-flops FF1 to FF(L−1) in the configuration illustrated in FIG. 1) that holds each bit of the gray code is small. As in the comparative example, in a case where a flip-flop in which data is inverted every clock cycle in order to generate a reference signal is provided as a reference flip-flop, the power consumption due to the data inversion in the reference flip-flop is significantly larger than the power consumption due to the data inversion in the flip-flop holding each bit of the gray code, and the power consumption of the gray code counter increases.

To cope with this, in the embodiment, the first circuit block 11 is configured such that the frequency at which the data held by the reference flip-flop is inverted is lower than that in the comparative example. Reduction in the frequency of the inversion of the data held by the reference flip-flop lowers the power consumption due to the data inversion in the reference flip-flop, so that the power consumption of the gray code counter 1 is reduced.

Specifically, the first circuit block 11 includes two reference flip-flops FFr1 and FFr2 and an inverter INVr. Each of the reference flip-flops FFr1 and FFr2 is a D flip-flop including a Q terminal, a D terminal, a clock terminal, and a reset terminal.

The clock terminals of the reference flip-flops FFr1 and FFr2 receive input of the clock signal CLK, and the reset terminals of the reference flip-flops FFr1 and FFr2 receive input of the reset signal RSTN. Note that, in this example, the reference flip-flops FFr1 and FFr2 are reset in a case where the reset signal RSTN is "0".

The Q terminal of the reference flip-flop FFr1 is connected to an input terminal of the inverter INVr. An output terminal of the inverter INVr is connected to the D terminal of the reference flip-flop FFr2. A Q terminal of the reference flip-flop FFr2 is connected to the D terminal of the reference flip-flop FFr1.

Therefore, the data held by the reference flip-flops FFr1 and FFr2 are inverted at a time interval twice as long as the clock cycle of the clock signal CLK. The frequency of the inversion of the data held by the reference flip-flops FFr1 and FFr2 is less than the frequency of the inversion of the data held by the reference flip-flop according to the comparative example, so that the power consumption of the gray code counter 1 is reduced as compared with that in the comparative example.

A signal that is output from the Q terminal of the reference flip-flop FFr2 is a data signal Q0. The Q terminal of the reference flip-flop FFr2 is connected to a data output terminal TQ0. The data output terminal TQ0 outputs the data signal Q0 output from the Q terminal of the reference flip-flop FFr2.

The signal that is output from the Q terminal of the reference flip-flop FFr2 (that is, the data signal Q0), the signal that is output from the Q terminal of the reference flip-flop FFr1, and the signal that is output from the output terminal of the inverter INVr are input, as reference signals, to the second circuit block 12.

The signal that is output from the Q terminal of the reference flip-flop FFr1 is referred to as a data signal Q(−1) for the sake of convenience. The data signal Q(−1) is not output outside the gray code counter 1.

The signal that is output from the output terminal of the inverter INVr is referred to as a carry generation signal P0 for the sake of convenience.

In the second circuit block 12, the element block 13_1 generates a carry signal C0 and a carry generation signal P1 based on the data signal Q0, the data signal Q(−1), and the carry generation signal P0. As a configuration therefor, the element block 13_1 includes two AND circuits ANp1 and ANc1 and an inverter INV1.

The Q terminal of the reference flip-flop FFr2 included in the first circuit block 11 is connected to one of two input terminals of the AND circuit ANc1, and the data signal Q0 output from the Q terminal of the reference flip-flop FFr2 is input to the one of two input terminals of the AND circuit ANc1. The output terminal of the inverter INVr is connected to the other of the two input terminals of the AND circuit ANc1, and the carry generation signal P0 output from the output terminal of the inverter INVr is input to the other of the two input terminals of the AND circuit ANc1.

An output terminal of the AND circuit ANc1 is connected to the other of two input terminals of an XOR circuit XOR1 included in the adder AD1. The AND circuit ANc1 performs an AND operation of the data signal Q0 and the carry generation signal P0, and a signal obtained by the AND operation is input to the XOR circuit XOR1 as the carry signal C0.

The Q terminal of the reference flip-flop FFr2 is connected to the input terminal of the inverter INV1, and the data signal Q0 output from the Q terminal of the reference flip-flop FFr2 is input to the input terminal of the inverter INV1. The inverter INV1 performs an inversion operation on the data signal Q0.

The Q terminal of the reference flip-flop FFr1 is connected to one of two input terminals of the AND circuit ANp1, and the data signal Q(−1) output from the Q terminal of the reference flip-flop FFr1 is input to the one of the two input terminals of the AND circuit ANp1. An output terminal of the inverter INV1 is connected to the other of the two input terminals of the AND circuit ANp1, and the data signal Q0 inverted by the inverter INV1 is input to the other of the two input terminals of the AND circuit ANp1. The AND circuit ANp1 performs an AND operation of the data signal Q(−1) and the inverted data signal Q0. The signal obtained by the AND operation is output from the element block 13_1 as the carry generation signal P1.

In the example illustrated in FIG. 1, the second circuit block 12 operates on the carry signals C0 to C(L−2) by the ripple carry method. As described above, the second circuit block 12 may be configured to operate on the carry signals C0 to C(L−2) by the carry look ahead method. In a case where the carry look head method is used, the second circuit block 12 is configured to include, for example, an arithmetic circuit that collectively operates on the carry signals C1 to C(L−2) based on the carry generation signal P1 instead of the element blocks 13_2 to 13_(L−2).

FIG. 2 is a timing chart illustrating an example of transition of various signals according to the clock signal CLK and the reset signal RSTN in the gray code counter 1 according to the first embodiment. In FIG. 2, L is "4" for easy understanding.

In the case of reset by the reset signal RSTN (immediately before timing t0 in FIG. 2), the carry generation signal P0 is "1", and the carry generation signals P1 and P2, the carry signal C, and the data signal Q are "0".

Then, it is shown that when the reset by the reset signal RSTN is canceled (timing t0), the data signal Q(−1) output from the Q terminal of the reference flip-flop FFr1, the carry generation signal P0 which is a signal obtained by inverting the data signal Q(−1), and the data signal Q0 output from the Q terminal of the reference flip-flop FFr2 transition with a waveform obtained by dividing the clock signal CLK by four. That is, in a case where the clock cycle of the clock signal CLK is denoted as CC, the data held by the reference flip-flops FFr1 and FFr2 periodically changes in the cycle of 4CC.

FIG. 3 is a truth table corresponding to the timing chart illustrated in FIG. 2. It is known from FIG. 3 that any one bit of the four-bit gray codes Q0 to Q3 changes every clock cycle, and the data signal Q(−1) from which data of the four-bit gray codes Q0 to Q3 is generated is inverted every two clock cycles.

As described above, the gray code counter 1 of the first embodiment includes the reference flip-flop FFr1, the reference flip-flop FFr2, the inverter INVr, the (L−1) adders AD1 to AD(L−1), the second circuit block 12, and the data output terminals TQ0 to TQ(L−1). The clock signal CLK is input to the clock terminal of the reference flip-flop FFr1 and the clock terminal of the reference flip-flop FFr2. The data signal Q0, which is a signal output from the Q terminal of the reference flip-flop FFr2, is input to the D terminal of the reference flip-flop FFr1. The inverter INVr performs an inversion operation on the data signal Q(−1) output from the Q terminal of the reference flip-flop FFr1. The data signal Q(−1) inverted by the inverter INVr, that is, the carry generation signal P0, is input to the D terminal of the reference flip-flop FFr2. The adders AD1 to AD(L−1) respectively operate on different bits of the (L−1)-bit gray codes by performing addition based on the input carry signal C. The element block 13_1 of the second circuit block 12 generates the carry signal C0 by performing an AND operation of the data signal Q0 and the carry generation signal P0 by the AND circuit ANc1. In addition, the element blocks 13_2 to 13_(L−2) of the second circuit block 12 generates the carry signals C1 to C(L−2) input to the adders AD2 to AD(L−1) based on the carry generation signal P1 obtained from the data signal Q0 and the data signal Q(−1).

Therefore, the frequency of the inversion of the data held by the reference flip-flops (for example, the reference flip-flops FFr1 and FFr2) necessary for the operation of the reference signal is reduced, so that the power consumption of the gray code counter 1 is reduced.

Further, according to the first embodiment, each adder AD (denoted as an adder ADj) includes the flip-flop FFj and the XOR circuit XORj. The XOR circuit XORj inputs, to the D terminal of the flip-flop FFj, a signal obtained by the exclusive OR of the signal output from the Q terminal of the flip-flop FFj, that is, the signal Qj, and the carry signal C(j−1).

Therefore, each adder AD can perform addition based on the input carry signal C.

Note that, according to the first embodiment, the second circuit block 12 generates the carry signal C based on the ripple carry method. For example, the second circuit block 12 inverts the data signal Q0 by the inverter INV1, and performs an AND operation of the inverted data signal Q0 and the data signal Q(−1) by the AND circuit ANp1. The second circuit block 12 generates the carry signal C1 that is input to the adder AD2 by performing an AND operation, by the AND circuit ANc2, of the carry generation signal P1, which is a signal calculated by the AND circuit ANp1, and the data signal Q1 output from the adder AD1.

Second Embodiment

The gray code changes only with one bit per clock cycle. Therefore, the gray code counter has a feature that it is possible to reduce the influence of an error that may occur when the output value of the gray code counter is acquired asynchronously with the operation of the gray code counter. The feature enables the gray code counter to be utilized, for example, in an apparatus that handles two different clock signals.

A gray code of a second embodiment is provided in a semiconductor device to which data is input in synchronization with a first clock signal and which processes the data based on a second clock signal. As an example of a system including such a semiconductor device, a memory system SYS will be described.

Figure 4:
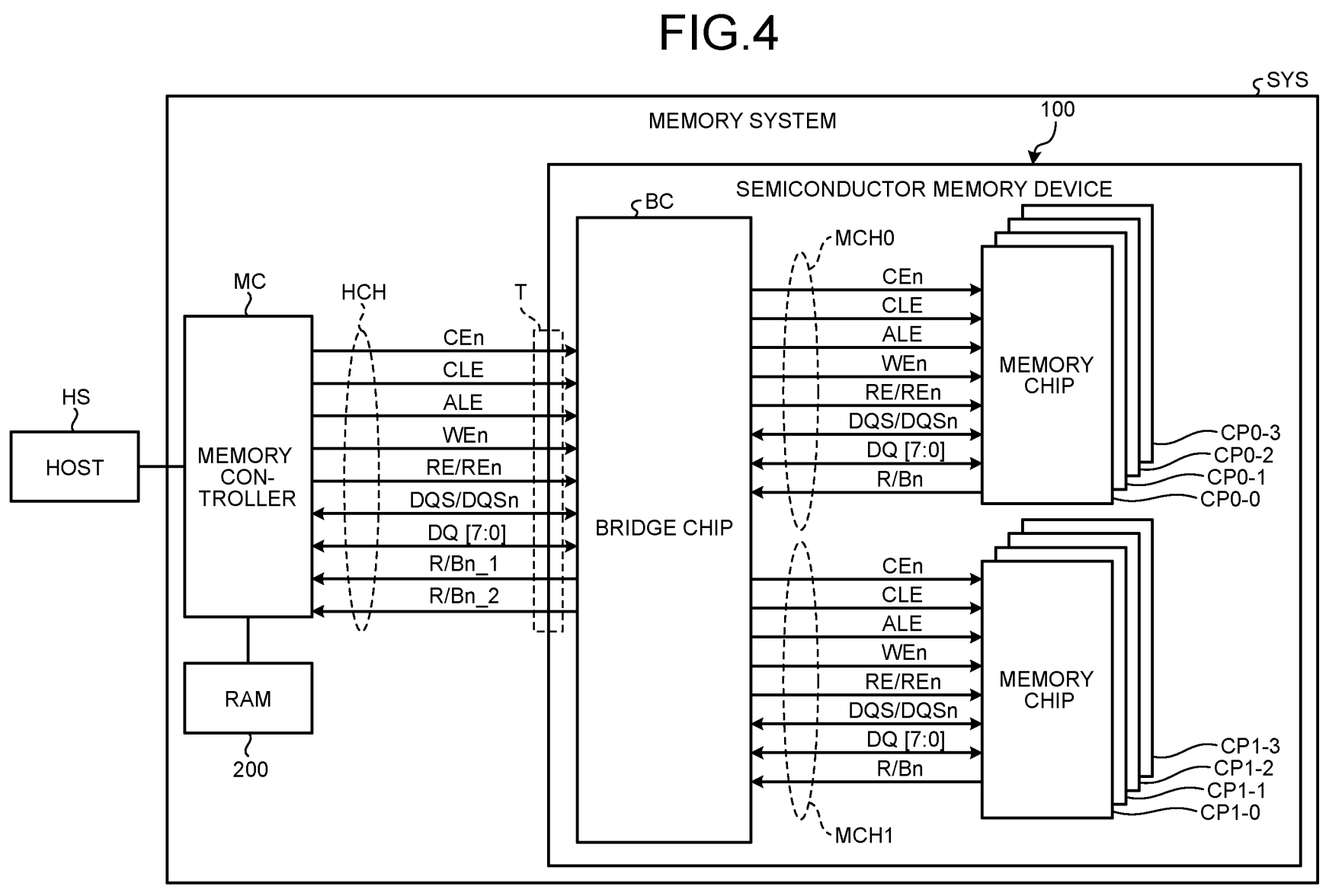

FIG. 4 is a schematic diagram illustrating an example of a configuration of the memory system SYS according to the second embodiment.

The memory system SYS can be connected to a host HS. The standard with which a communication path connecting the host HS and the memory system SYS conforms and with which communication via the communication path conforms is not limited to a specific standard. The host HS is, for example, a personal computer, a personal digital assistant, a server, or the like. The host HS transmits various commands including a write command and a read command to the memory system SYS.

The memory system SYS includes a semiconductor memory device 100, a memory controller MC, and a random-access memory (RAM) 200.

The memory controller MC is a control circuit that controls the semiconductor memory device 100. As part of the control over the semiconductor memory device 100, the memory controller MC executes data transfer between the host HS and the semiconductor memory device 100 in response to an access command from the host HS.

The RAM 200 provides the memory controller MC with a storage area such as a buffer area, a cache area, and an area in which a program is loaded. For example, the memory controller MC can buffer, into the RAM 200, the data transferred between the host HS and the semiconductor memory device 100. In addition, the memory controller MC loads a firmware program into the RAM 200 to use the program, and buffers or caches various management data in the RAM 200.

The semiconductor memory device 100 includes an external terminal group T, a bridge chip BC, and a plurality of memory chips CP0-0 to CP0-3 and CP1-0 to CP1-3.

The bridge chip BC is an example of the semiconductor device of the second embodiment.

Each of the plurality of memory chips CP0-0 to CP0-3 and CP1-0 to CP1-3 is, for example, a memory chip of a nonvolatile memory such as a NAND flash memory.

The semiconductor memory device 100 can be implemented as a multi chip package (MCP) in which the memory chips CP0-0 to CP0-3 and the memory chips CP1-0 to CP1-3 are stacked. In a case where the semiconductor memory device 100 is implemented as the MCP, in the semiconductor memory device 100, the periphery of the bridge chip BC and the plurality of memory chips CP0-0 to CP0-3 and CP1-0 to CP1-3 may be sealed with a mold resin.

In addition, the semiconductor memory device 100 includes a plurality of channels connecting the plurality of memory chips CP0-0 to CP0-3 and CP1-0 to CP1-3 to the bridge chip BC. Each of the plurality of channels is referred to as a memory channel MCH in the sense of a channel connecting the NAND flash memory.

In the example of FIG. 4, the semiconductor memory device 100 includes memory channels MCH0 and MCH1 as a plurality of memory channels MCH. Then, the four memory chips CP0-0 to CP0-3 are connected to the bridge chip BC via the memory channel MCH0, and the four memory chips CP1-0 to CP1-3 are connected to the bridge chip BC via the memory channel MCH1.

Each memory channel MCH is configured based on a predetermined standard. In a case where each of the memory chips CP0-0 to CP0-3 and CP1-0 to CP1-3 is a NAND flash memory, the predetermined standard is, for example, a toggle DDR standard.

Note that the number of memory chips CP of the semiconductor memory device 100 is not limited to eight. In addition, the number of memory channels MCH connecting the bridge chip BC and the plurality of memory chips CP is not limited to two. Further, the number of memory chips CP connected to one memory channel MCH is not limited to four.

Hereinafter, each of the memory chips CP0-0 to CP0-3 and CP1-0 to CP1-3 may be referred to as a memory chip CP.

The semiconductor memory device 100 is connected to the memory controller MC via one channel. This one channel is referred to as a host channel HCH in the sense of a channel on the host side as viewed from the bridge chip BC.

The host channel HCH is configured based on a predetermined standard. In a case where each memory chip CP is a NAND flash memory, the predetermined standard is, for example, a toggle DDR standard.

The host channel HCH includes a signal line that transfers a chip enable signal CEn, a signal line that transfers a command latch enable signal CLE, a signal line that transfers an address latch enable signal ALE, a signal line that transfers a write enable signal WEn, a signal line that transfers a read enable signal RE/REn, a signal line that transfers a data strobe signal DQS/DQSn, a signal line that transfers a data signal DQ[7:0] having a predetermined bit width (here, as an example, an eight-bit width), a signal line that transfers a ready/busy signal R/Bn_1, and a signal line that transfers a ready/busy signal R/Bn_2. Note that "n" marked at the end of a sign representing a signal means that the signal is caused to operate with negative logic. Whether each signal is caused to operate with negative logic or positive logic can be arbitrarily designed.

The chip enable signal CEn is a signal for enabling the memory chip CP to be accessed. The data strobe signal DQS/DQSn is a signal for instructing a counterpart device to capture data transmitted by the data signal DQ[7:0]. The data strobe signal DQS/DQSn is a differential signal including a data strobe signal DQS and a data strobe signal DQSn. The command latch enable signal CLE is a signal indicating that the data signal DQ[7:0] is a command. The address latch enable signal ALE is a signal indicating that the data signal DQ[7:0] is an address. The write enable signal WEn is a signal for instructing the counterpart device to capture a command or an address transmitted by the data signal DQ[7:0]. The read enable signal RE/REn is a signal for instructing the counterpart device to output the data signal DQ[7:0]. The read enable signal RE/REn is a differential signal including a read enable signal RE and a read enable signal REn. The ready/busy signal R/Bn_1 and the ready/busy signal R/Bn_2 are signals indicating whether the state is a ready state of waiting for a command to be received or a busy state in which a command is received but cannot be executed. Note that the configuration of the signal line that transfers the ready/busy signal R/Bn included in the host channel HCH is not limited to the above example. For example, the host channel HCH may include one signal line for transferring one ready/busy signal R/Bn that is generated by wired OR connection or the like based on the ready/busy signal R/Bn related to the memory channel MCH0 and the ready/busy signal R/Bn related to the memory channel MCH1.

Each of the memory channels MCH0 and MCH1 can transmit and receive a signal group of the same type as the signal group of the host channel HCH. Specifically, each of the memory channels MCH0 and MCH1 includes a signal line that transfers the chip enable signal CEn, a signal line that transfers the command latch enable signal CLE, a signal line that transfers the address latch enable signal ALE, a signal line that transfers the write enable signal WEn, a signal line that transfers the read enable signal RE/REn, a signal line that transfers the data strobe signal DQS/DQSn, a signal line that transfers the data signal DQ [7:0], and a signal line that transfers the ready/busy signal R/Bn.

In a case where writing data (referred to as write data) is requested by a write command from the host HS, the memory controller MC temporarily stores the write data into the RAM 200. Then, the memory controller MC performs various processing such as error correction coding on the write data stored in the RAM 200, and transfers the processed write data to the bridge chip BC as the data signal DQ[7:0]. When transferring the data signal DQ[7:0] to the bridge chip BC, the memory controller MC transfers, to the bridge chip BC, the data strobe signal DQS/DQSn toggled to synchronize with the transfer of the data signal DQ[7:0].

The bridge chip BC sequentially fetches the write data transferred as the data signal DQ[7:0] from the memory controller MC according to toggling of the data strobe signal DQS/DQSn. The bridge chip BC transfers, as the data signal DQ[7:0], the fetched write data to any of the memory chips CP. When transferring the data signal DQ[7:0] to the memory chip CP, the bridge chip BC transfers the data strobe signal DQS/DQSn toggled to synchronize with the transfer of the data signal DQ[7:0] to the memory chip CP.

In a case where reading data (referred to as read data) is requested by a read command from the host HS, the memory controller MC instructs the memory chip CP storing the read data to perform a read operation via the bridge chip BC. The memory chip CP in which the read data is stored transfers the read data to the bridge chip BC as the data signal DQ[7:0] according to the instruction of the read operation. When transferring the data signal DQ[7:0] to the bridge chip BC, the memory chip CP transfers, to the bridge chip BC, the data strobe signal DQS/DQSn toggled to synchronize with the transfer of the data signal DQ[7:0].

The bridge chip BC sequentially fetches the read data transferred as the data signal DQ[7:0] from the memory chip CP according to toggling of the data strobe signal DQS/DQSn. The bridge chip BC transfers, as the data signal DQ[7:0], the fetched read data to the memory controller MC. When transferring the data signal DQ[7:0] to the memory controller MC, the bridge chip BC transfers the data strobe signal DQS/DQSn toggled to synchronize with the transfer of the data signal DQ[7:0] to the memory controller MC.

In this manner, the bridge chip BC fetches data transferred from an external device (in this case, one of the memory controller MC and the memory chip CP) by the data strobe signal DQS/DQSn toggled to synchronize with the transfer of the data. Then, the bridge chip BC transfers the fetched data to another external device (in this case, the other of the memory controller MC and the memory chip CP).

The bridge chip BC includes an oscillator circuit (an oscillator circuit 101 to be described later) that generates a clock signal used for various processing. The clock signal generated by the oscillator circuit 101 is referred to as a clock signal CLK0. The bridge chip BC uses the clock signal CLK0 to perform various processing on data fetched using the data strobe signal DQS/DQSn.

The frequency of the clock signal CLK0 varies due to various factors including a variation in temperature of the oscillator circuit 101 and a variation in voltage supplied to the oscillator circuit 101. However, in order to process the data fetched using the data strobe signal DQS/DQSn without fail, the frequency of the clock signal CLK0 is required to be equal to or higher than the frequency of the data strobe signal DQS/DQSn. Accordingly, the bridge chip BC has a configuration described below in order to maintain the frequency of the clock signal CLK0 equal to or higher than the frequency of the data strobe signal DQS/DQSn.

Figure 5:
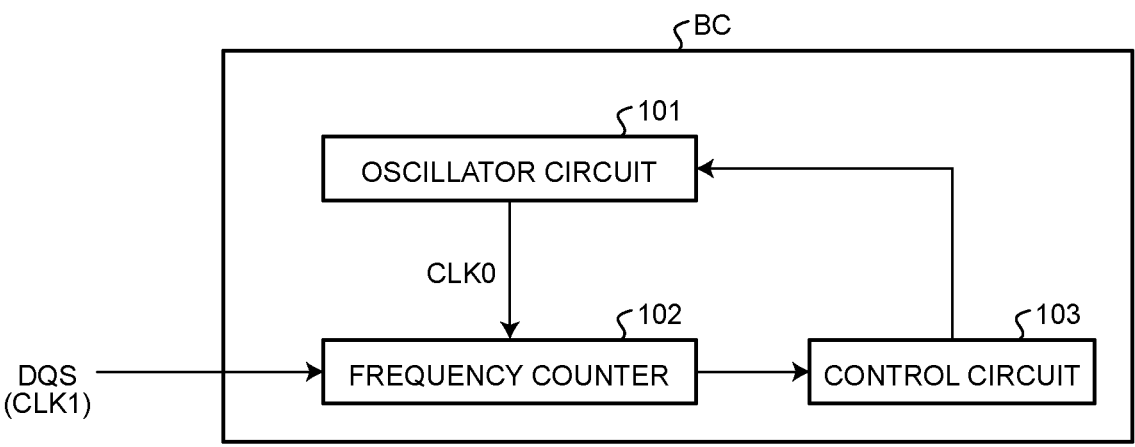
FIG. 5 is a schematic diagram illustrating an example of a configuration of a part of a bridge chip according to the second embodiment.

FIG. 5 is a schematic diagram illustrating an example of a configuration of a part of the bridge chip BC according to the second embodiment. The bridge chip BC includes the oscillator circuit 101, a frequency counter 102, and a control circuit 103.

The oscillator circuit 101 is an oscillator capable of controlling an oscillation frequency by an input from an external terminal. The oscillator circuit 101 generates the clock signal CLK0. In one example, the oscillator circuit 101 is a voltage-controlled oscillator (VCO).

The frequency counter 102 receives input of the data strobe signal DQS/DQSn transferred from the outside (the memory controller MC or the memory chip CP). The frequency counter 102 counts the input data strobe signal DQS/DQSn. The count by the frequency counter 102 corresponds to the count of the frequency of the data strobe signal DQS/DQSn.

For easy understanding, here, it is assumed that the data strobe signal DQS of the data strobe signal DQS/DQSn is input to the frequency counter 102, and the frequency of the data strobe signal DQS is counted. The frequency of the data strobe signal DQS is equal to the frequency of the data strobe signal DQSn.

In addition, the data strobe signal DQS input to the frequency counter 102 is handled as a signal similar to the clock signal for convenience, and may be referred to as a clock signal CLK1.

The control circuit 103 regulates the frequency of the clock signal CLK0 based on the count value by the frequency counter 102 such that the frequency of the clock signal CLK0 becomes equal to or higher than the frequency of the data strobe signal DQS/DQSn. The control circuit 103 changes the frequency of the clock signal CLK0 by inputting a control signal to a control terminal of the oscillator circuit 101.

Figure 6:
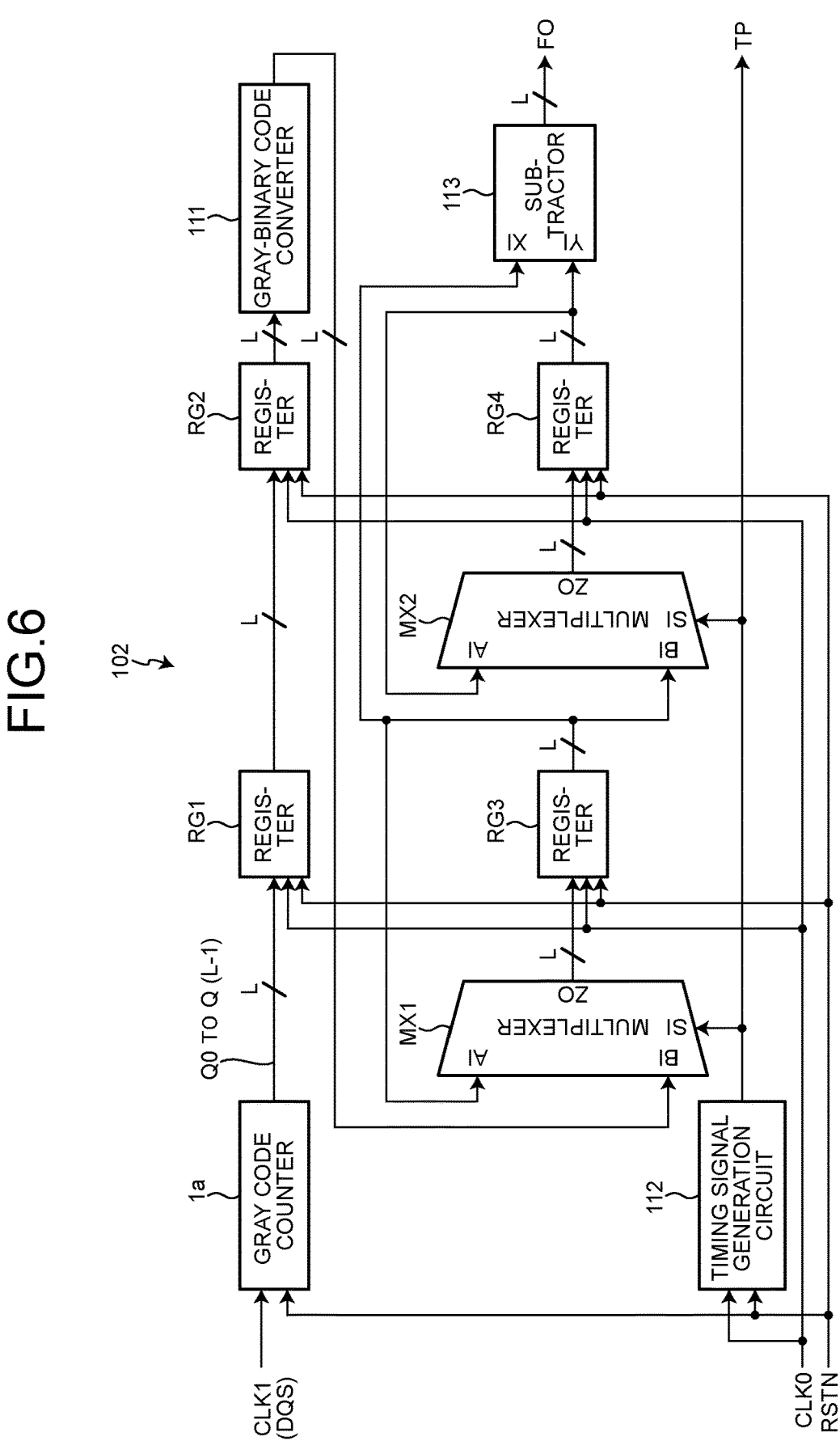
FIG. 6 is a schematic diagram illustrating an example of a configuration of a frequency counter according to the second embodiment.

FIG. 6 is a schematic diagram illustrating an example of a configuration of the frequency counter 102 according to the second embodiment.

The frequency counter 102 includes a gray code counter 1a, four registers RG1 to RG4, a gray-binary code converter 111, two multiplexers MX1 and MX2, a timing signal generation circuit 112, and a subtractor 113.

The reset signal RSTN is input to reset terminals of the gray code counter 1a, the registers RG1 to RG4, and the timing signal generation circuit 112. The clock signal CLK0 is input to clock terminals of the registers RG1 to RG4.

The gray code counter 1a is a semiconductor integrated circuit having a configuration similar to that of the gray code counter 1 of the first embodiment. The clock signal CLK1, that is, the data strobe signal DQS is input to a clock terminal (the clock terminal TCLK in the first embodiment) of the gray code counter 1a, and the gray code counter 1a counts the input clock signal CLK1. The gray code counter 1a outputs L-bit gray code Q0 to Q(L−1) according to the count value of the clock signal CLK1 from a data output terminal (a set of the data output terminals TQ0 to TQ(L−1) in the first embodiment).

A data input terminal of the register RG1 is connected to the data output terminal of the gray code counter 1a. The register RG1 stores therein the L-bit gray code Q0 to Q(L−1) output from the data output terminal of the gray code counter 1a at the timing based on the clock signal CLK0, more specifically, at the timing of the rising edge of the clock signal CLK0.

A data input terminal of the register RG2 is connected to a data output terminal of the register RG1. The gray-binary code converter 111 is connected to a data output terminal of the register RG2.

The gray-binary code converter 111 converts the L-bit gray code Q0 to Q(L−1) into L-bit binary data. As a result, L-bit data in which the count value of the clock signal CLK1 is represented as a binary number is obtained.

The multiplexer MX1 includes two input terminals AI and BI to each of which the L-bit data is input, an output terminal ZO that outputs the L-bit data, and an input terminal SI to which a selection signal is input. An output terminal of the register RG3 is connected to the input terminal AI of the multiplexer MX1. An output terminal of the gray-binary code converter 111 is connected to the input terminal BI of the multiplexer MX1.

The output terminal of the multiplexer MX1 is connected to an input terminal of the register RG3.

The multiplexer MX2 includes two input terminals AI and BI to each of which the L-bit data is input, an output terminal ZO that outputs the L-bit data, and an input terminal SI to which a selection signal is input. An output terminal of the register RG4 is connected to the input terminal AI of the multiplexer MX2. The output terminal of the register RG3 is connected to the input terminal BI of the multiplexer MX2.

Based on the clock signal CLK0, the timing signal generation circuit 112 generates a timing pulse TP that becomes "1" during one clock cycle for each predetermined number of clock cycles (hereinafter, referred to as a count period). The timing pulse TP is input as the selection signal to the multiplexers MX1 and MX2.

In a case where the input selection signal (that is, the timing pulse TP) is "0", each of the multiplexers MX1 and MX2 selects an input from the input terminal AI. In a case where the input selection signal (that is, the timing pulse TP) is "1", each of the multiplexers MX1 and MX2 selects an input from the input terminal BI.

The subtractor 113 includes two input terminals XI and YI to each of which the L-bit data is input, and an output terminal. The output terminal of the register RG3 is connected to the input terminal XI. The output terminal of the register RG4 is connected to the input terminal YI. The subtractor 113 subtracts the L-bit data input to the input terminal YI from the L-bit data input to the input terminal XI, and outputs L-bit data obtained by the subtraction as data (hereinafter, frequency data) FO corresponding to the frequency of the clock signal CLK1. The frequency data FO corresponds to a count value of the clock signal CLK1 in the count period.

Figure 7:
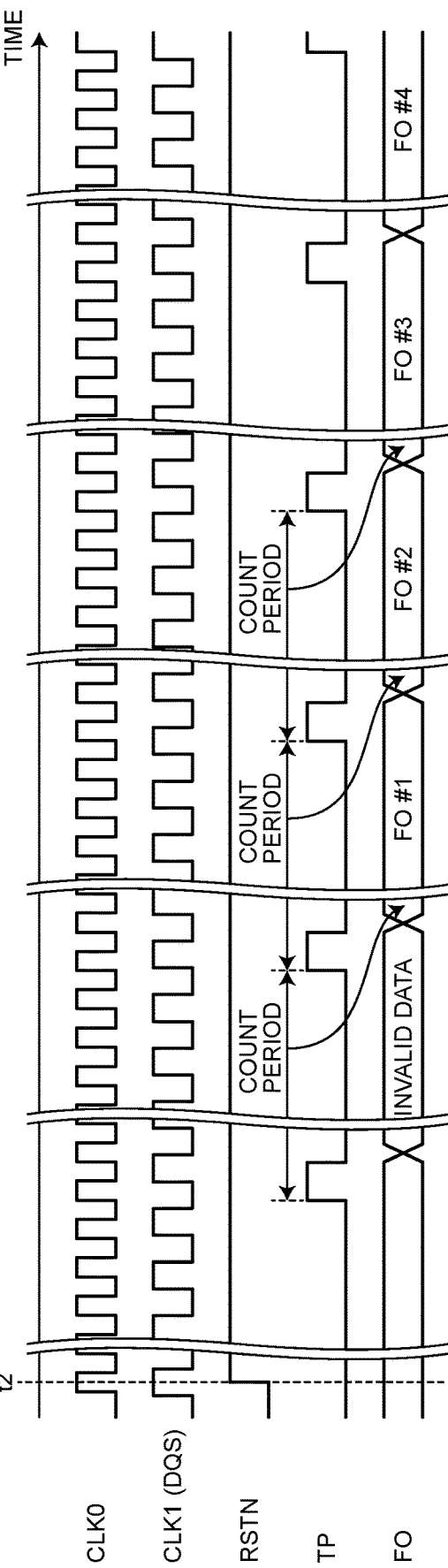
FIG. 7 is a timing chart illustrating an example of waveforms of various signals in the frequency counter according to the second embodiment.

FIG. 7 is a timing chart illustrating an example of waveforms of various signals in the frequency counter 102 according to the second embodiment. As illustrated in FIG. 7, when the reset by the reset signal RSTN is canceled (timing t2) and the timing pulse TP set to "1" for each count period is input to the multiplexers MX1 and MX2, the count value of the clock signal CLK1 (that is, the data strobe signal DQS) obtained in each count period is output as the frequency data FO in the next count period.

The control circuit 103 acquires the frequency data FO as a count value by the frequency counter 102. The control circuit 103 regulates the oscillation frequency of the oscillator circuit 101 based on the frequency data FO acquired from the frequency counter 102.

For example, when determining that the frequency of the clock signal CLK0 is lower than the frequency of the clock signal CLK1 based on the frequency data FO acquired from the frequency counter 102, the control circuit 103 increases the oscillation frequency of the oscillator circuit 101. When determining that the frequency of the clock signal CLK0 is not lower than the frequency of the clock signal CLK1, the control circuit 103 does not change the oscillation frequency of the oscillator circuit 101. Note that the method for regulating the oscillation frequency of the oscillator circuit 101 is not limited thereto.

As described above, according to the second embodiment, the bridge chip BC includes the gray code counter 1a that counts the clock signal CLK1, the oscillator circuit 101 that generates the clock signal CLK0, and the register RG1 that stores therein the gray code output from the gray code counter 1a at the timing based on the clock signal CLK0.

Note that the gray code counter 1a according to the second embodiment can be applied not only to the bridge chip BC but also to any semiconductor device that operates based on a clock signal different from a clock signal to be counted by the gray code counter 1a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit configured to generate an L-bit, wherein L is an integer of 3 or more gray code according to a count value of a first clock signal, the semiconductor integrated circuit comprising:
    a first flip-flop including a clock terminal to which the first clock signal is configured to be input;
    a second flip-flop including a clock terminal to which the first clock signal is configured to be input, a first signal output from a Q terminal of the second flip-flop being input to a D terminal of the first flip-flop;
    an inverter configured to perform an inversion operation on a second signal output from a Q terminal of the first flip-flop, a third signal obtained by inverting the second signal output from the inverter being input to a D terminal of the second flip-flop;

(L−1) adders, each configured to respectively generate and operate on a different bit of the gray code by performing addition based on a respective bit of an input carry signal;
    a circuit block configured to generate the input carry signal and output a first bit of the input carry signal to a first adder of the (L−1) adders by performing an AND operation of the first signal and the third signal, and output a respective bit of the remaining bit or bits of the input carry signal to each of a second adder to an (L−1)th adder of the (L−1) adders based on the first signal and the second signal;
    a first terminal configured to output the first signal; and
    (L−1) second terminals configured to output a set of signals output from the (L−1) adders.

2. The semiconductor integrated circuit according to claim 1, wherein;
    each of the (L−1) adders includes:
        a third flip-flop; and
        an exclusive OR circuit configured to perform an exclusive OR operation of an input carry signal and a fourth signal output from a Q terminal of the third flip-flop, and input a signal obtained by the exclusive OR operation to a D terminal of the third flip-flop, and wherein
    the (L−1) second terminals are configured to output a set of fourth signals of the respective (L−1) adders.

3. The semiconductor integrated circuit according to claim 2, wherein the circuit block is configured to invert the first signal, perform an AND operation of the second signal and a fifth signal obtained by inverting the first signal, and generate a respective one of the input carry signal to be output to the second adder of the (L−1) adders by performing an AND operation of a fourth signal from the first adder and a sixth signal obtained by performing an AND operation of the fifth signal and the second signal.

4. A semiconductor device comprising:
    the semiconductor integrated circuit according to claim 1;
    an oscillator circuit configured to generate a second clock signal; and
    a register configured to store therein the gray code output from the first terminal and the (L−1) second terminals of the semiconductor integrated circuit at timing based on the second clock signal.

5. A semiconductor device comprising:
    the semiconductor integrated circuit according to claim 2;
    an oscillator circuit configured to generate a second clock signal; and
    a register configured to store therein the gray code output from the first terminal and the (L−1) second terminals of the semiconductor integrated circuit at timing based on the second clock signal.

6. A semiconductor device comprising:
    the semiconductor integrated circuit according to claim 3;
    an oscillator circuit configured to generate a second clock signal; and
    a register configured to store therein the gray code output from the first terminal and the (L−1) second terminals of the semiconductor integrated circuit at timing based on the second clock signal.

7. A semiconductor memory device comprising:
    the semiconductor device according to claim 4; and
    a memory chip, wherein
    the first clock signal is a data strobe signal for transfer of data that is transferred to or from the memory chip, and
    the semiconductor device further includes a control circuit configured to control, based on the gray code stored in the register, the oscillator circuit such that a frequency of the second clock signal becomes equal to or higher than a frequency of the data strobe signal.

8. A semiconductor memory device comprising:

the semiconductor device according to claim 5; and a memory chip, wherein the first clock signal is a data strobe signal for transfer of data that is transferred to or from the memory chip, and the semiconductor device further includes a control circuit configured to control, based on the gray code stored in the register, the oscillator circuit such that a frequency of the second clock signal becomes equal to or higher than a frequency of the data strobe signal.

9. A semiconductor memory device comprising:

the semiconductor device according to claim 6; and a memory chip, wherein the first clock signal is a data strobe signal for transfer of data that is transferred to or from the memory chip, and the semiconductor device further includes a control circuit configured to control, based on the gray code stored in the register, the oscillator circuit such that a frequency of the second clock signal becomes equal to or higher than a frequency of the data strobe signal.

10. The semiconductor memory device according to claim 7, wherein the memory chip includes a nonvolatile memory.

11. The semiconductor memory device according to claim 8, wherein the memory chip includes a nonvolatile memory.

12. The semiconductor memory device according to claim 9, wherein the memory chip includes a nonvolatile memory.

13. The semiconductor memory device according to claim 10, wherein the nonvolatile memory includes a NAND flash memory.

14. The semiconductor memory device according to claim 11, wherein the nonvolatile memory includes a NAND flash memory.

15. The semiconductor memory device according to claim 12, wherein the nonvolatile memory includes a NAND flash memory.

16. The semiconductor integrated circuit according to claim 3, wherein the circuit block is configured to invert the fourth signal from the first adder, perform an AND operation of the sixth signal and a seventh signal obtained by inverting the fourth signal, and generate a respective one of the input carry signal to be output to the third adder that is next to the second adder of the (L−1) adders by performing an AND operation of a fourth signal from the second adder and an eighth signal obtained by performing an AND operation of the seventh signal and the sixth signal.

17. A semiconductor device comprising:

the semiconductor integrated circuit according to claim 16;

an oscillator circuit configured to generate a second clock signal; and a register configured to store therein the gray code output from the first terminal and the (L−1) second terminals of the semiconductor integrated circuit at timing based on the second clock signal.

18. A semiconductor memory device, comprising:

the semiconductor device according to claim 17; and a memory chip, wherein the first clock signal is a data strobe signal for transfer of data that is transferred to or from the memory chip, and the semiconductor device further includes a control circuit configured to control, based on the gray code stored in the register, the oscillator circuit such that a frequency of the second clock signal becomes equal to or higher than a frequency of the data strobe signal.

19. The semiconductor memory device according to claim 18, wherein the memory chip includes a nonvolatile memory.

20. The semiconductor memory device according to claim 19, wherein the nonvolatile memory includes a NAND flash memory.

* * * * *